(12) United States Patent
Londhe et al.

(10) Patent No.: US 11,754,624 B1
(45) Date of Patent: Sep. 12, 2023

(54) PROGRAMMABLE SCAN CHAIN DEBUG TECHNIQUE

(71) Applicant: Seagate Technology LLC, Fremont, CA (US)

(72) Inventors: Bharat Londhe, Pune (IN); Deep Neema, Pune (IN); Komal Shah, Mumbai (IN)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 65 days.

(21) Appl. No.: 17/679,686

(22) Filed: Feb. 24, 2022

(51) Int. Cl.
*G01R 31/3177* (2006.01)
*G01R 31/3183* (2006.01)
*G01R 31/3185* (2006.01)
*G01R 31/3181* (2006.01)
*G01R 31/319* (2006.01)

(52) U.S. Cl.
CPC ..... *G01R 31/3177* (2013.01); *G01R 31/3181* (2013.01); *G01R 31/31921* (2013.01); *G01R 31/318307* (2013.01); *G01R 31/318335* (2013.01); *G01R 31/318533* (2013.01); *G01R 31/318544* (2013.01); *G01R 31/318547* (2013.01)

(58) Field of Classification Search
CPC ............ G01R 31/3177; G01R 31/3181; G01R 31/318307; G01R 31/318335; G01R 31/318533; G01R 31/318544; G01R 31/318547; G01R 31/31921
USPC .......................... 714/726, 727, 729, 734, 735
See application file for complete search history.

(56) References Cited

U.S. PATENT DOCUMENTS

| 7,058,869 | B2 | 6/2006 | Abdel-Hafez et al. |
| 7,284,175 | B2 | 10/2007 | Wang et al. |
| 7,376,873 | B2 | 5/2008 | Vranken et al. |
| 8,479,067 | B2 * | 7/2013 | Chandra ........ G01R 31/318547 714/729 |
| 8,650,524 | B1 * | 2/2014 | Chakravadhanula ........................ G06F 30/327 716/136 |

(Continued)

FOREIGN PATENT DOCUMENTS

| IE | 20080066 A1 | 9/2008 |
| WO | 2005031378 A1 | 4/2005 |

OTHER PUBLICATIONS

Bahl et al., Unifying Scan Compression, 2014, IEEE, pp. 191-196. (Year: 2014).*

(Continued)

*Primary Examiner* — John J Tabone, Jr.
(74) *Attorney, Agent, or Firm* — Westman, Champlin & Koehler, P.A.

(57) ABSTRACT

A method includes injecting scan patterns into an input of a decompressor that distributes the scan patterns to a plurality of scan chains whose outputs are coupled to inputs of a compressor, which provides a compressed scan test result representing the plurality of scan chains. The method also includes, in response to the compressed scan test result being indicative of failure, identifying a particular scan chain of the plurality of scan chains that is responsible for the failure by a debug circuit that is coupled to the input of the decompressor and to a compressor output. The debug circuit enables an output of any single scan chain of the plurality of scan chains to be available at the compressor output while suppressing outputs of all other scan chains of the plurality of scan chains.

20 Claims, 5 Drawing Sheets

(56) References Cited

U.S. PATENT DOCUMENTS

| | | | |
|---|---|---|---|
| 8,904,256 B1* | 12/2014 | Chakravadhanula | ........................ G01R 31/318547 714/731 |
| 9,229,055 B2 | 1/2016 | Narayanan et al. | |
| 9,733,307 B1 | 8/2017 | Salem et al. | |
| 9,952,283 B2* | 4/2018 | Narayanan | ..... G01R 31/318547 |
| 10,324,131 B1* | 6/2019 | Endrinal | ........ G01R 31/318558 |
| 10,353,001 B2 | 7/2019 | Bhagwat et al. | |
| 10,459,029 B2 | 10/2019 | Gangwal et al. | |
| 10,481,205 B2 | 11/2019 | Bhagwat et al. | |
| 10,921,372 B2 | 2/2021 | Bhagwat et al. | |
| 2002/0188903 A1 | 12/2002 | Chu et al. | |
| 2006/0041813 A1 | 2/2006 | Rajski et al. | |
| 2006/0048028 A1 | 3/2006 | Blasi et al. | |
| 2006/0095818 A1* | 5/2006 | Bratt | .............. G01R 31/318547 714/726 |
| 2007/0067688 A1 | 3/2007 | Vranken et al. | |
| 2009/0254786 A1 | 10/2009 | Cheng et al. | |
| 2010/0095173 A1* | 4/2010 | Rahman | ......... G01R 31/318547 714/E11.155 |
| 2010/0218062 A1 | 8/2010 | Wang et al. | |
| 2011/0047425 A1 | 2/2011 | Hapke et al. | |
| 2011/0307750 A1* | 12/2011 | Narayanan | ..... G01R 31/318547 714/E11.055 |
| 2013/0055041 A1* | 2/2013 | Tekumalla | ..... G01R 31/318544 714/E11.155 |
| 2014/0317463 A1* | 10/2014 | Chandra | ........ G01R 31/318566 714/729 |
| 2015/0025819 A1* | 1/2015 | Chandra | ........ G01R 31/318544 702/58 |
| 2019/0369162 A1 | 12/2019 | Londhe et al. | |
| 2023/0128466 A1* | 4/2023 | Srinivasan | ..... G01R 31/318563 714/727 |

OTHER PUBLICATIONS

Chakravadhanula et al., SmartScan—Hierarchical Test Compression for Pin-limited Low Power Designs, 2013, IEEE, pp. 1-9. (Year: 2013).*

Han et al., Embedded Test Decompressor to Reduce the Required Channels and Vector Memory of Tester for Complex Processor Circuit, May 2007, IEEE, pp. 531-540. (Year: 2007).*

Nodari S. Sitchinava, "Dynamic Scan Chains—A Novel Architecture to Lower the Cost of VLSI Test", dated Aug. 8, 2003, 64 pages.

Rcik Nelson, "Using EDT Test Points to reduce test time and cost", Evaluation Engineering, dated Jun. 14, 2015, 15 pages.

* cited by examiner

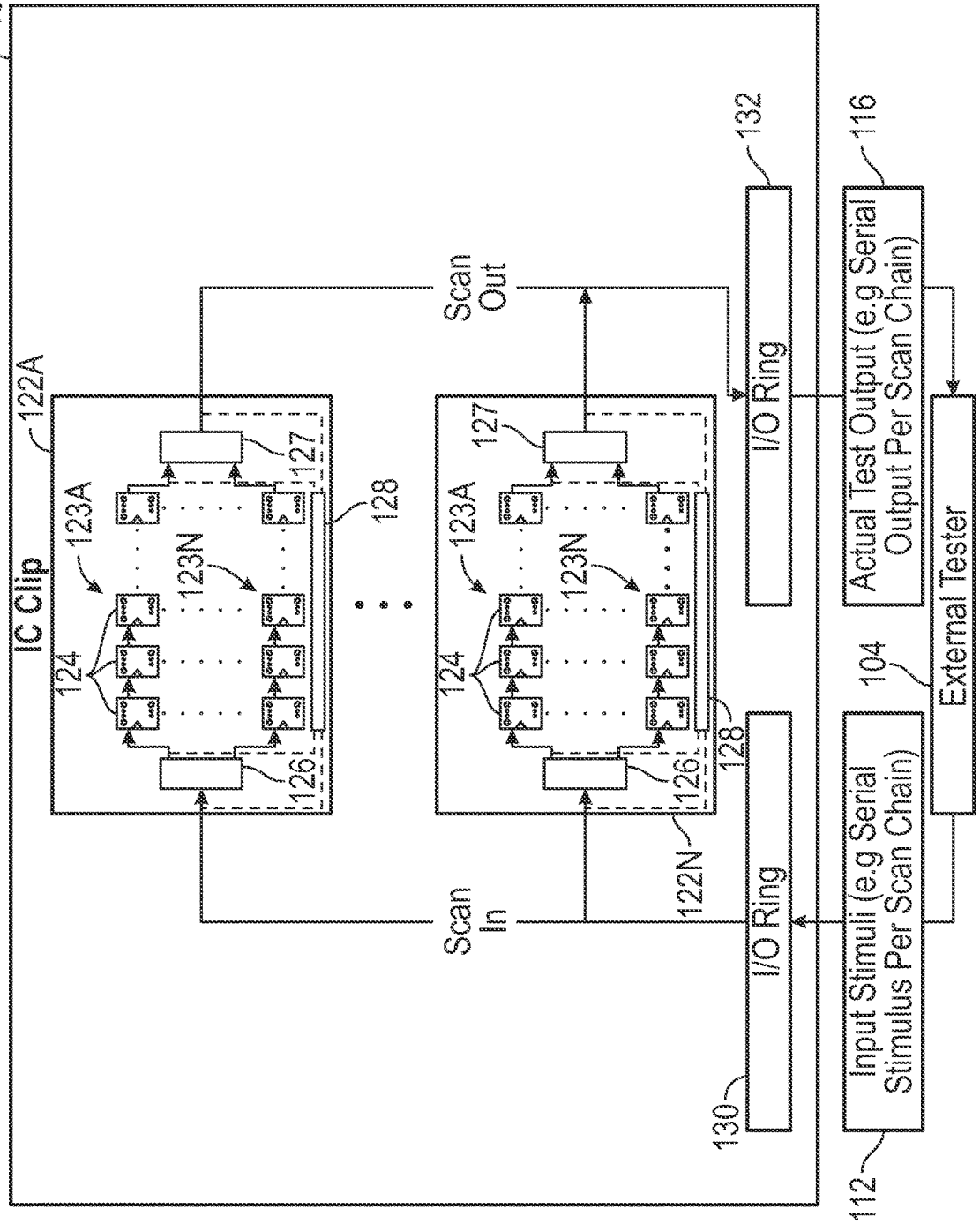

PROGRAMMABLE SCAN CHAIN DEBUG TECHNIQUE

SUMMARY

In one embodiment, a method is provided. The method includes injecting scan patterns into an input of a decompressor that distributes the scan patterns to a plurality of scan chains whose outputs are coupled to inputs of a compressor, which provides a compressed scan test output representing the plurality of scan chains. The method also includes, in response to the compressed scan test output being indicative of failure, identifying a particular scan chain of the plurality of scan chains that is responsible for the failure by a debug circuit that is coupled to the input of the decompressor and to a compressor output. The debug circuit enables an output of any single scan chain of the plurality of scan chains to be available at the compressor output while suppressing outputs of all other scan chains of the plurality of scan chains.

In another embodiment, an integrated circuit is provided. The integrated circuit includes a scan compression circuit that includes a top-level input, a top-level output, and a plurality of scan chains between the top-level input and the top-level output. The scan compression circuit also includes a decompressor between the top-level input and the plurality of scan chains. The decompressor is configured to receive scan patterns via the top-level input and configured to distribute the scan patterns to the plurality of scan chains. The scan compression circuit further includes a compressor between the plurality of scan chains and the top-level output. The compressor is configured to provide a compressed scan test result representing the plurality of scan chains. The integrated circuit also includes a debug circuit that is coupled to the top-level input and to the top-level output. The debug circuit is configured to enable an output of any single scan chain of the plurality of scan chains to be available at the top-level output while suppressing outputs of all other scan chains of the plurality of scan chains.

In yet another embodiment, an apparatus is provided. The apparatus includes a debug circuit coupled to a top-level input and to a top-level output of a scan compression circuit comprising a plurality of scan chains. The debug circuit is configured to enable an output of any single scan chain of the plurality of scan chains to be available at the top-level output while suppressing outputs of all other scan chains of the plurality of scan chains.

Other features and benefits that characterize embodiments of the disclosure will be apparent upon reading the following detailed description and review of the associated drawings.

BRIEF DESCRIPTION OF THE DRAWINGS

FIG. 1B is a block diagram of the IC chip scan test setup of FIG. 1A with additional IC chip details in accordance with one embodiment.

DETAILED DESCRIPTION OF ILLUSTRATIVE EMBODIMENTS

Embodiments of the disclosure relate to integrated circuit (IC) chip scan testing, and more particularly to debugging logic added to traditional scan compression logic.

In compressed scanning, scan testing is carried out on individual "top-level" scan chains, which have multiple internal scan chains, and scan test results are provided for the top-level scan chains. If a failed scan test result is obtained for a top-level scan chain, it is generally not possible to identify which internal scan chain of the multiple internal scan chains of the top-level scan chain is faulty from the test result. Embodiments of the disclosure add debug logic that enables identification of a faulty internal scan chain. Prior to providing details regarding the different embodiments, a description of an illustrative IC chip testing environment is provided below.

Figure 1A:
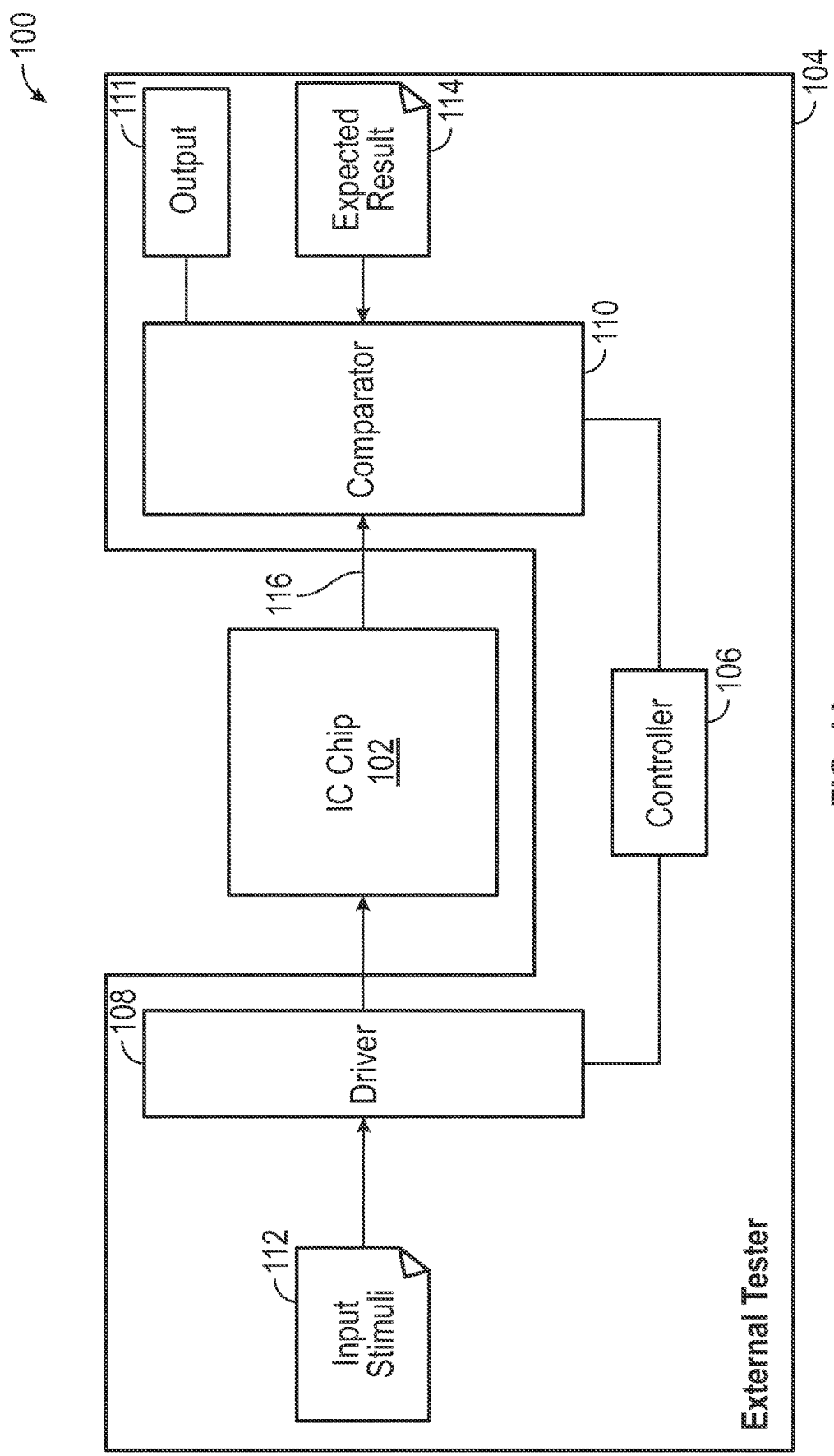
FIG. 1A is a simplified block diagram of an integrated circuit (IC) chip scan test setup.

FIG. 1A shows an illustrative IC chip testing environment in which certain specific embodiments disclosed herein may be useful. The IC chip testing environment shown in FIG. 1A is for illustration purposes only. Embodiments of the present disclosure are not limited to any particular IC chip testing environment such as the IC chip testing environment shown in FIG. 1A. Embodiments of the present disclosure are illustratively practiced within any number of different types of IC chip testing environments.

It should be noted that the same or like reference numerals may be used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1A is a simplified block diagram showing an IC chip scan test setup 100. In IC chip scan test setup 100, an IC chip 102 is coupled to an external chip tester 104 in a manner shown in FIG. 1A. External chip tester 104 includes a controller 106, a driver 108, a comparator 110 and a tester output 111. The controller 106 can receive scan test-related commands that are entered/selected by a user, and responsively carry out a scan test on the IC chip 102. Also, with the help of controller 106, input stimuli 112 and expected results 114 may be programmed into chip tester 104.

Carrying out a scan test using IC chip scan test setup 100 involves injecting, by driver 108, input stimuli 112 into IC chip 102, and obtaining scan test outputs 116 from IC chip 102. The scan test outputs 116 are provided to comparator 110 of external chip tester 104. Comparator 110 compares the scan test outputs 116 and the expected results 114 and provides scan test results, which are indicative of a condition of the IC chip 102. The scan test results may be obtained by a user via tester output 111.

In general, input stimuli 112 may include sequences of ones and zeros, called scan bits. Scan compression is a way of reducing the volume of such bits sent from the tester 104 to IC chip 102. In traditional scan compression, for each top-level scan chain, there is a decompressor at a scan input side and a compressor at a scan output side. Scan bits input to the decompressor via a top-level input are broadcasted by the decompressor to multiple internal scan chains. Internal scan chain outputs are compressed (e.g., using exclusive or (XOR) logic) in the compressor, and its output is brought out on a top-level port. In this configuration, single internal scan chain data cannot be shifted out for debugging.

As indicated above, to address the above-mentioned problem, embodiments of disclosure add debug logic that enables identification of a faulty internal scan chain. FIG. 1B illustrates IC chip scan test setup 100 with IC chip 102 under test having traditional compression logic, and debug logic in accordance with an embodiment of the disclosure. As can be seen in FIG. 1B, IC chip 102 includes multiple top-level scan chains 122A-122N, with each top-level scan chain 122 including a plurality of internal scan chains 123A-123N. Each internal scan chain 123 includes flip-flops 124 connected together as shown in FIG. 1B to form the internal scan chain 123. In each top-level scan chain 122, the internal scan chains 123 are connected to a decompressor 126 on a input side, and to a compressor 127 on an output side. In accordance with embodiments of the disclosure, IC chip 102 includes debug logic or circuitry 128 coupled to each decompressor 126 input, each compressor 127 output, and to internal scan chains 123 of each top-level scan chain 122. Details regarding debug logic or circuitry 128 are provided further below in connection with FIG. 2. In FIG. 1B, input/output (I/O) rings 130 and 132 represent I/O pins of the IC chip 102.

To test IC chip 102, input stimuli (e.g., scan bits or patterns) 112 are provided from external tester 104 to the IC chip 102 via I/O rings 130 to inputs of decompressors 126, and each decompressor 126 distributes the scan patterns to the internal scan chains 123 coupled to its output. The scan patterns are shifted through the flip-flops 124, whose final outputs are provided to compressors 127. Each compressor 127 combines the output information of the individual internal scan chains 123 to which it is connected and provides a compressed scan test output for the top-level scan chain 122. Scan test outputs 116 are provided to external tester 104 via I/O ring 132. External tester 104 utilizes the scan test outputs 116 to determine a scan test result in a manner described above in connection with FIG. 1A.

When compressed scan test results for one or more top-level scan chains 122 are indicative of failure of the top-level scan chain(s) 122, debug logic 128 is employed to determine the particular internal scan chain(s) 123 responsible for the failure of the top-level scan chain(s) 122. Debug logic 128 includes digital circuitry that enables an output of any single internal scan chain 123 of a top-level scan chain 122 to be available at the compressor 127 output while suppressing outputs of all other internal scan chains 123 of the top-level scan chain 122. An example detailed embodiment of debug logic 128 is described below in connection with FIG. 2.

Figure 2:
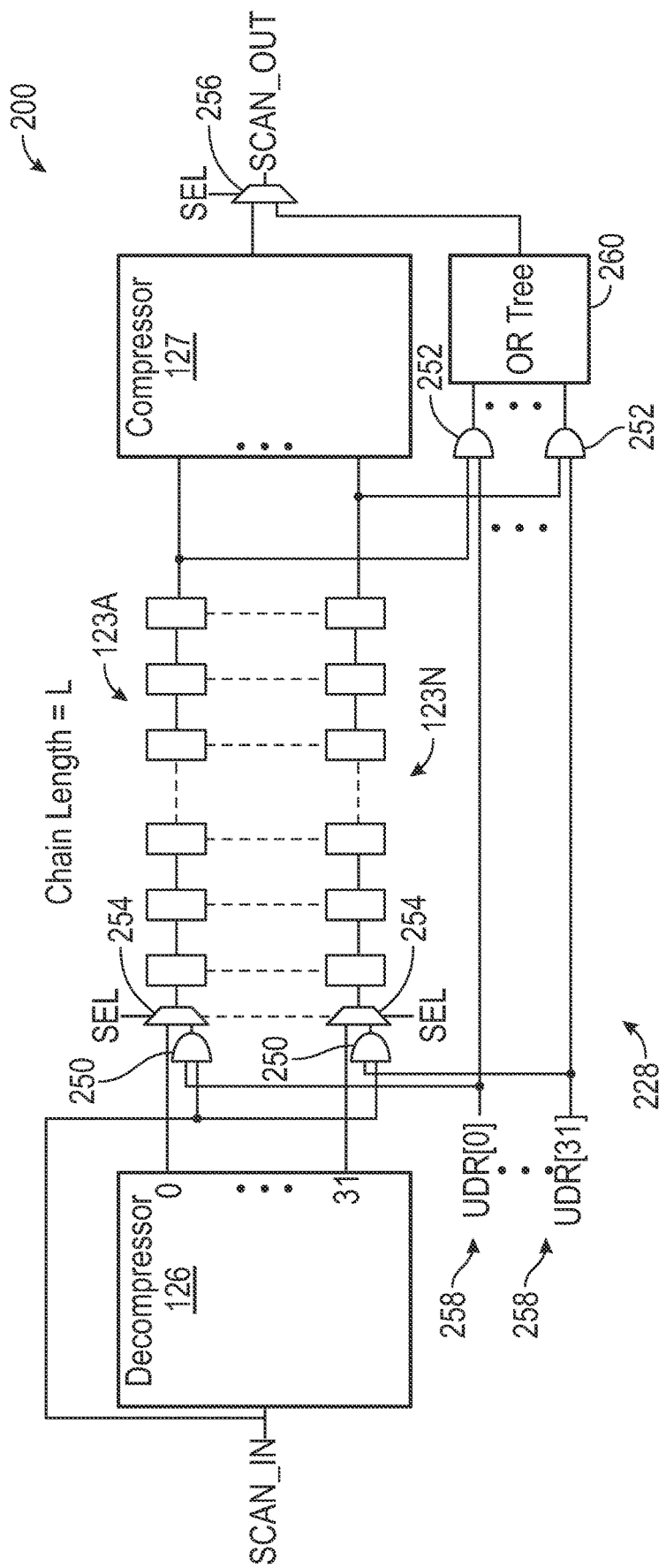
FIG. 2 is a diagrammatic illustration of circuitry that includes scan compression and debug logic in accordance with one embodiment.

FIG. 2 is a diagrammatic illustration of circuitry 200 that includes scan compression and debug logic or circuitry in accordance with one embodiment. In the embodiment shown in FIG. 2, debug circuitry 228 includes an AND gate 250 coupled to each internal scan chain 123 on an input side, and an AND gate 252 coupled to each internal scan chain 123 on an output side. Debug circuitry further includes a multiplexer (MUX) 254 coupled to each internal scan chain 123 on the input side, such that each different MUX 254 receives an input for a different decompressor 126 output branch. Decompressor 126 output branches are denoted by 0-31 in FIG. 2. Each MUX 254 also receives an input from an output of a corresponding AND gate 250. On the output side, a single MUX 256 has a first input that is coupled to scan chains 123 via AND gates 252 and an OR tree 260, and a second input that is coupled to a compressor 127 output. Debug circuitry 228 further includes user defined registers (UDRs) 258, which are sometimes simply referred to as registers herein, coupled to AND gates 250 (at a scan input side) and 252 (at a scan output side). Details regarding connections between the different elements of debug circuit 228 and the operation of those elements is described below using an example scenario having 5 top-level scan chains, and each top-level scan chain having 32 internal scan chains.

For the example of 5 top-level scan chains with each top-level scan chain having 32 scan chains, on an input side, each top-level scan input (SCAN_IN) drives 32 AND gates 250 with one input of each AND gate 250 being driven from SCAN_IN, and each AND gate's 250 other input being controlled by a UDR 258 bit. MUXes 254, which receive inputs from each of the 32 internal output branches of decompressor 126 and from AND gate 250 outputs, select between the input from the decompressor 126 and the output of the AND gate 250. All the MUXes 254 have a common select pin SEL that may controlled by a UDR (not shown) bit. When one of the 32 internal chains 123 is selected and mapped between top level scan-input SCAN_IN and scan-output SCAN_OUT, the other internal scan chains 123 are held inactive by driving "0" on the AND gate 250 inputs through UDRs 258 connected to the other internal scan chains 123. This ensures that only one internal scan chain 123 of interest is active and the other internal scan chains 123 are shifting "0" through their flip-flops 124.

On the output side, AND gates 252 are placed in parallel with compressor 127, and therefore the original scan compression implementation is not disturbed. As indicated earlier, each internal scan chain 123 output is tapped and connected to one input of a respective AND gate 252. The other input of each AND gate 252 is driven from the same UDR 258 control as the input side. Outputs of all the AND gates 252 are concatenated through OR tree structure 260.

Figure 3A:
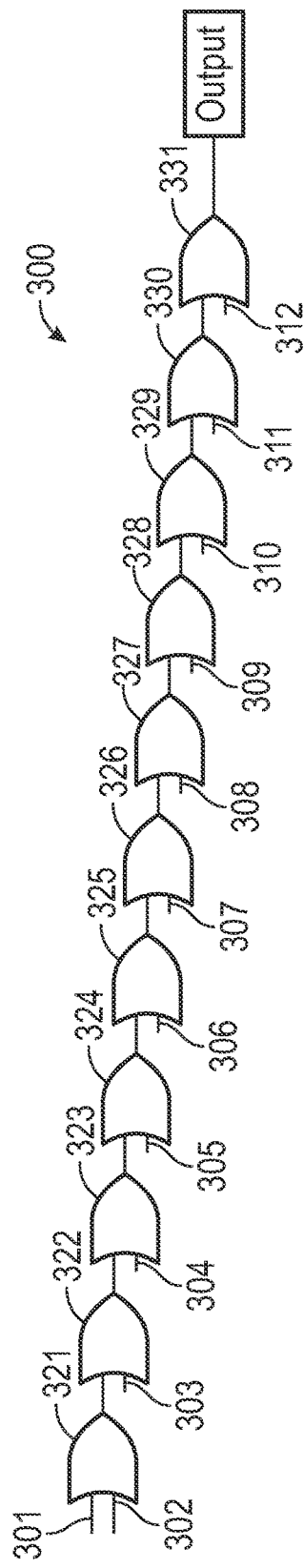
FIGS. 3A and 3B are example of OR tree circuit portions that may be employed in the debug logic of FIG. 2.
Figure 3B:
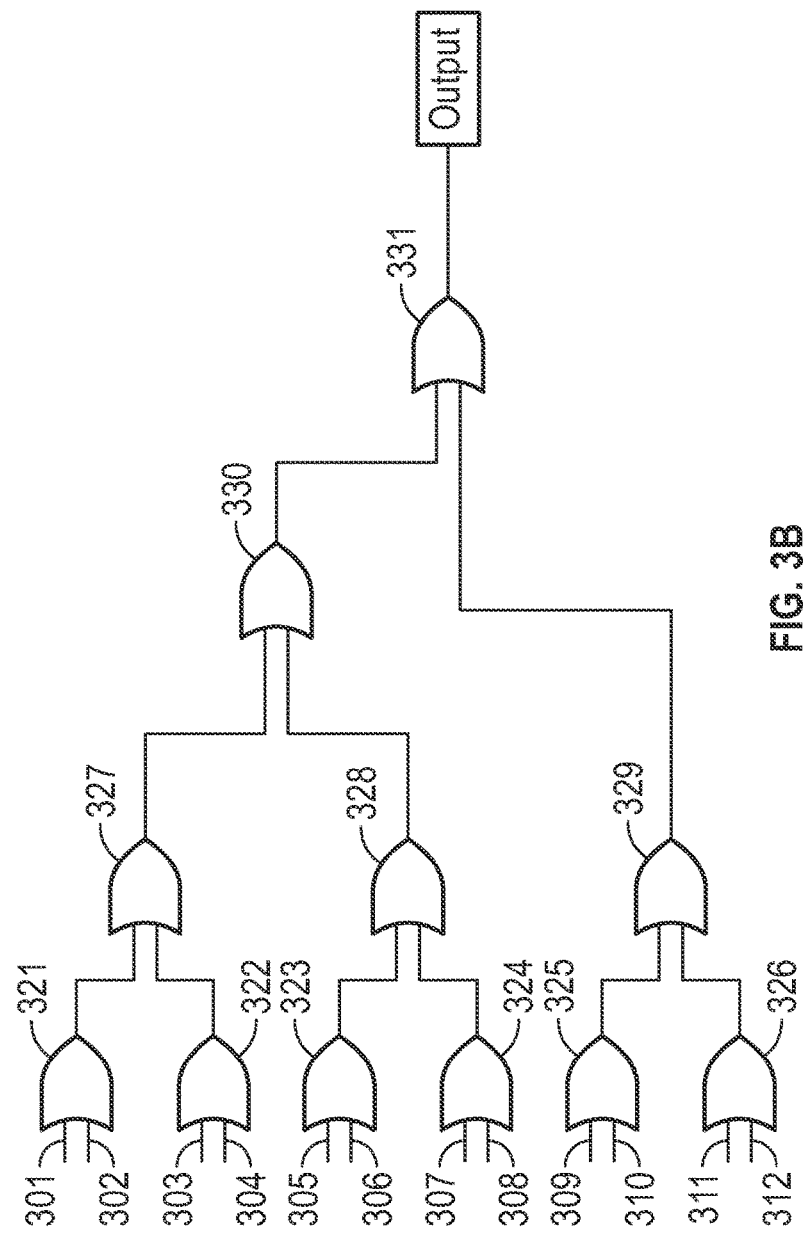

FIGS. 3A and 3B show example connection configurations of OR gates that may be employed in an OR tree structure such as 260. In the interest of simplification, only 12 inputs are used in the examples of FIGS. 3A and 3B.

However, the connection configuration concepts of FIGS. 3A and 3B are applicable to the 32-input example discussed herein, or to other sizes of inputs and/or scan chains.

FIG. 3A shows connection configuration 300 in which a first input 301 and a second input 302 are provided to a first OR gate 321 whose output serves as one input to a second OR gate 322. The other input to the second OR gate 322 is a third input 303. The remaining inputs 304-312 are concatenated in a similar manner using OR gates 323-331.

FIG. 3B shows a connection configuration 350 that is equivalent to connection configuration 300 of FIG. 3A, and therefore provides a same output as connection configuration 300 for a same set of input bits. However, connection configuration 350 has a smaller depth than connection configuration 300 of FIG. 3A, and may therefore have a shorter delay. In general, any suitable OR gate connection configuration may be used for OR tree 260.

Referring back to FIG. 2, the 32 internal scan chain 123 outputs are ORed within OR tree 260, and the output from the OR tree 260 is MUXed at 256 with the output from scan compressor 127. During a normal IC test, MUX 256 is set to select the output of scan compressor 127 and propagate it to SCAN_OUT. For debugging after the normal IC test produces a failed result, MUX 256 is set to select the output of OR tree 260 and propagate it to SCAN_OUT.

As described above, debug circuitry 228 is added on to each top-level scan chain 200. In the example of 5 top level scan chains with 32 internal scan chains included in each of the 5 top-level scan chains, the additional gates included are:
  A. On the input side:
    1) 5*32=160 MUXes
    2) 5*32=160 AND gates
  B. On the output side:
    1) 5*1=5 MUXes
    2) 5*32=160 AND gates
    3) A number of OR gates that depends on the design of the OR tree In the above example, if 32 internal scan chains are numbered from (31:0) and internal scan chain "4" is to be debugged, then only internal scan chain 4's UDR 258 control is set to "1." The remaining 31 UDRs 258 (31:5, 3:0) are set to "0," which makes outputs of AND gates 250 and 252 connected to those 31 UDRs 258 equal to "0". This results in only internal chain 4 being available between top-level SCAN_IN/SCAN_OUT ports. At a time, one internal scan chain from each top-level scan chain can be selected for hookup between top-level SCAN_IN and SCAN_OUT ports. It should be noted that a common set of UDRs 258 may be coupled to multiple (e.g., 5 in this example) groups of internal scan chains. Thus, when the specific UDR 258 is enabled to observe internal scan chain "4," it will select the fourth internal chain from each of the 5 top-level scan chains. With minimal gates and control from UDRs, any of the internal scan chains 123 can be hooked between top level SCAN_IN/SCAN_OUT ports. This makes the above-described debug technique programmable.

Debug logic of the type shown in FIG. 2 may be incorporated into a wide variety of IC chips having different levels of complexity and for use in different types of devices/systems (e.g., automobiles, televisions, radio receivers, juice makers, video processors, watches/clocks, memory devices, etc.). An example system that may include one or more IC chips in accordance with embodiments of the disclosure is described below in connection with FIG. 4.

Figure 4:
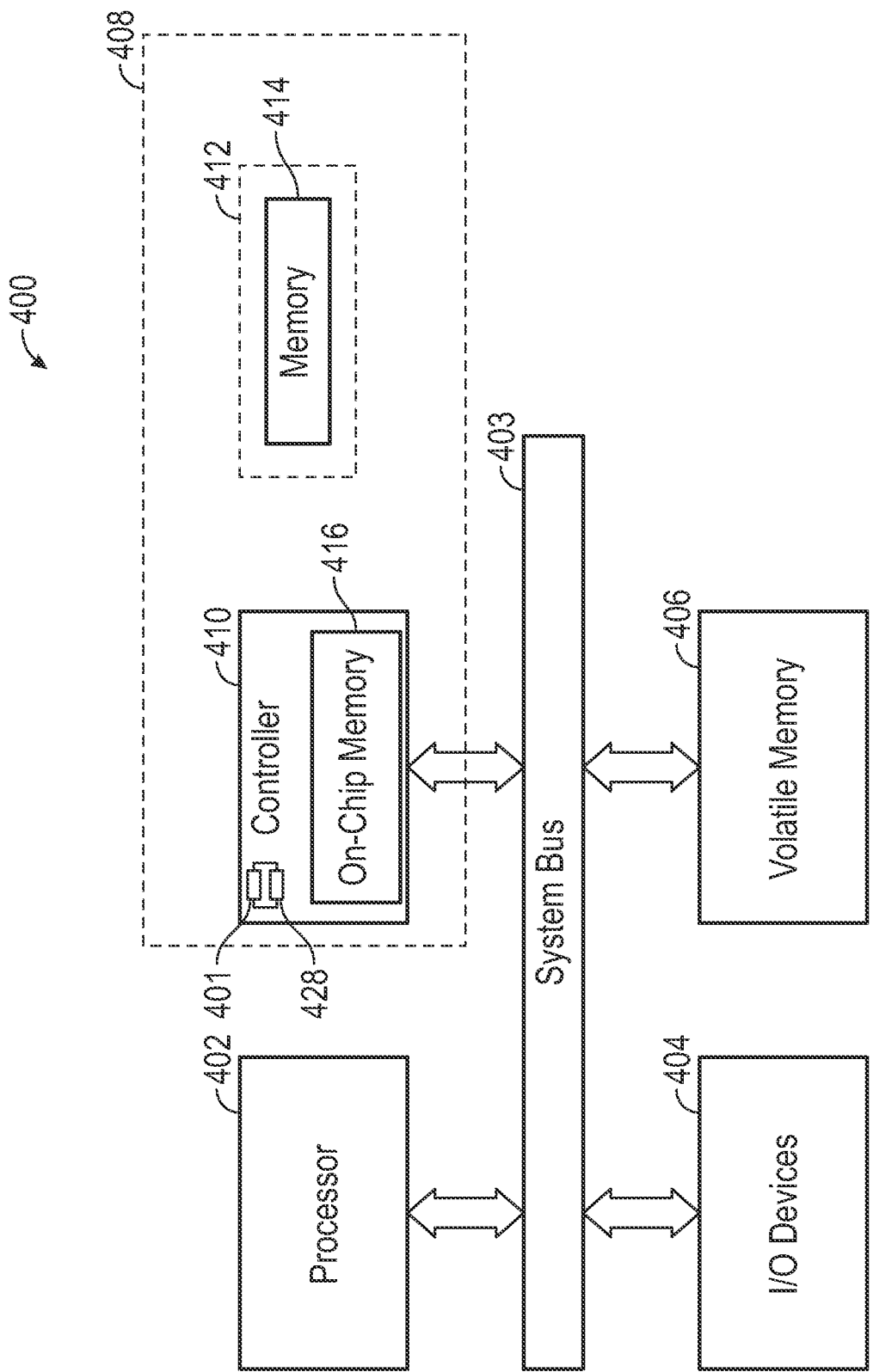
FIG. 4 is a simplified block diagram of an illustrative embodiment of a system of data storage management that has one or more IC chips that may include debug logic in accordance with embodiments of the disclosure.

FIG. 4 is a simplified block diagram of an illustrative embodiment of a system of data storage management 400 that has one or more IC chips that may include debug logic in accordance with embodiments of the disclosure. The system of data storage management 400 may include a processor 402 connected to a system bus 403 which also can be connected to input/output (I/O) devices 404, such as a keyboard, monitor, modem, storage device, or pointing device. The system bus 403 may also be coupled to a memory 406, which may be a random access volatile memory. The system bus may additionally be coupled to a memory device 408.

The memory device 408 may include a controller 410, which may be coupled to the processor 402 via a connection through the system bus 403. In one embodiment, the memory device 408 comprises at least one storage entity 412. Storage entity 412 may include one or more memories 414. In some embodiments, storage entity 412 may comprise a plurality of memories of various sizes and types.

During operation, the processor 402 may send commands and data to the memory device 408 to retrieve or store data. The controller 410 can receive the commands and data from the processor 402 and then manage the execution of the commands to store or retrieve data from storage entity 412. Controller 410 may be a complex IC that includes one or more on-chip memories (e.g., static random access memory (SRAM)) 416. Such a complex IC chip that integrates multiple components of an electronic system is known as a system-on-a-chip (SoC). Controller 410 includes in one embodiment scan compression circuitry 401 and debug logic 428, which is similar to debug logic 228 described above in connection with FIG. 2. Thus, debugging of controller 410 in accordance with embodiments of the disclosure may be carried out at any desired time.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
injecting scan patterns into an input of a decompressor that distributes the scan patterns to a plurality of scan chains whose outputs are coupled to inputs of a compressor, which provides a compressed scan test output representing the plurality of scan chains; and
in response to the compressed scan test output being indicative of failure, identifying a particular scan chain of the plurality of scan chains that is responsible for the failure by a debug circuit that is coupled to the input of the decompressor and to a compressor output, and that enables an output of any single scan chain of the plurality of scan chains to be available at the compressor output while suppressing outputs of all other scan chains of the plurality of scan chains.

2. The method of claim 1 and further comprising setting one register of a plurality of registers of the debug circuit coupled to the any single scan chain to a first predetermined value that enables the output of the any single scan chain of the plurality of scan chains to be available at the compressor output, and setting other registers of the plurality of registers coupled to the all other scan chains to a same second predetermined value that enables the output of the all other scan chains to be suppressed at the compressor output.

3. The method of claim 2 and further comprising:
providing the first predetermined value from the one register to:
a first input of one input-side AND gate of a plurality of input-side AND gates of the debug circuit coupled to an input side of the any single scan chain; and
a first input of one output-side AND gate of a plurality of output-side AND gates of the debug circuit coupled to an output side of the any single scan chain; and
providing the same second predetermined value from each of the other registers to:
first inputs of different other input-side AND gates of the plurality of input-side AND gates coupled to input sides of the all other scan chains; and
first inputs of different other output-side AND gates of the plurality of output-side AND gates coupled to output sides of the all other scan chains.

4. The method of claim 3 and further comprising:
providing the scan patterns to second inputs of the plurality of input-side AND gates; and
providing outputs of different scan chains of the plurality of scan chains to second inputs of the plurality of output-side AND gates.

5. The method of claim 4 and further comprising:
providing outputs of different input-side AND gates of the plurality of input-side AND gates to first inputs of different input-side multiplexers (MUXes) of a plurality of input-side MUXes of the debug circuit;
providing the scan patterns to second inputs of the plurality of input-side MUXes;
providing outputs of different input-side MUXes of the plurality of input-side MUXes to inputs of different corresponding individual scan chains of the plurality of scan chains;
providing outputs of different output-side AND gates of the plurality of output-side AND gates to inputs of an OR tree of the debug circuit; and
providing an output of the OR tree to a first input of an output-side MUX of the debug circuit.

6. The method of claim 5 and further comprising providing the compressed scan test output to a second input of the output-side MUX.

7. The method of claim 5 and further comprising, in response to the compressed scan test output being indicative of failure, selecting:
the first inputs of all the input-side MUXes of the plurality of input-side MUXes as the outputs of the different individual input-side MUXes of the plurality of input-side MUXes; and
the first input of the output-side MUX as an output of the output-side MUX, the output of the output-side MUX being the output of the any single scan chain of the plurality of scan chains.

8. An integrated circuit comprising:
a scan compression circuit comprising:
a top-level input;
a top-level output;
a plurality of scan chains between the top-level input and the top-level output;
a decompressor between the top-level input and the plurality of scan chains, the decompressor configured to receive scan patterns via the top-level input and configured to distribute the scan patterns to the plurality of scan chains;
a compressor between the plurality of scan chains and the top-level output, the compressor configured to provide a compressed scan test output representing the plurality of scan chains; and
a debug circuit coupled to the top-level input and to the top-level output, the debug circuit configured to enable an output of any single scan chain of the plurality of scan chains to be available at the top-level output while suppressing outputs of all other scan chains of the plurality of scan chains.

9. The integrated circuit of claim 8 and wherein the debug circuit comprises a plurality of registers, with each different register of the plurality of registers coupled to a different scan chain of the plurality of scan chains, and wherein each register of the plurality of registers is settable to a first predetermined value or a second predetermined value, and wherein setting the register coupled to the any single scan chain to the the first predetermined value enables the output of the any single scan chain to be available at the compressor output, and wherein setting each of the registers coupled to the all other scan chains to the second predetermined value enables the output of the all other scan chains to be suppressed at the compressor output.

10. The integrated circuit of claim 9 and wherein the debug circuitry further comprises:
  input-side debug circuitry coupled to inputs of each different scan chain of the plurality of scan chains, and coupled to the top-level input; and
  output-side debug circuitry coupled to outputs of each different scan chain of the plurality of scan chains, and coupled to the top-level output.

11. The integrated circuit of claim 10 and wherein the input-side debug circuitry comprises:
  a plurality of input-side AND gates; and
  a plurality of input-side multiplexers (MUXes),
  wherein:
    each different register of the plurality of registers is coupled to a first input of each different input-side AND gate of the plurality of input-side AND gates;
    the top-level input is coupled to a second input of each different input-side AND gate of the plurality of input-side AND gates;
    an output of each different input-side AND gate of the plurality of input-side AND gates is coupled to a first input of each different input-side MUX of the plurality of input-side MUXes;
    an output of the decompressor is coupled to a second input of each different input-side MUX of the plurality of input-side MUXes; and
    an output of each different input-side MUX of the plurality of input side MUX is coupled to an input of each different scan chain of the plurality of scan chains.

12. The integrated circuit of claim 10 and wherein the output-side debug circuitry comprises:
  a plurality of output-side AND gates;
  an OR tree; and
  an output-side MUX,
  wherein:
    each different register of the plurality of registers is coupled to a first input of each different output-side AND gate of the plurality of output-side AND gates;
    an output of each different scan chain of the plurality of different scan chains is coupled to a second input of each different output-side AND gate of the plurality of output-side AND gates;
    an output of each different output-side AND gate of the plurality of output-side AND gates is coupled to each different input of a plurality of inputs of the OR tree;
    an output of the OR tree is coupled to a first input of the output-side MUX;
    an output of the compressor is coupled to a second input of the output-side MUX; and
    an output of the output-side MUX is coupled to the top-level output.

13. The integrated circuit of claim 12 and wherein the OR tree comprises circuitry configured to concatenate the outputs of the plurality output-side AND gates.

14. An apparatus comprising:
  a debug circuit coupled to a top-level input and to a top-level output of a scan compression circuit comprising a plurality of scan chains, the debug circuit configured to enable an output of any single scan chain of the plurality of scan chains to be available at the top-level output while suppressing outputs of all other scan chains of the plurality of scan chains.

15. The apparatus of claim 14 and wherein the debug circuit comprises a plurality of registers, with each different register of the plurality of registers coupled to a different scan chain of the plurality of scan chains, and wherein each register of the plurality of registers is settable to a first predetermined value or a second predetermined value, and wherein setting the register coupled to the any single scan chain to the first predetermined value enables the output of the any single scan chain to be available at the top-level output, and wherein setting each of the registers coupled to the all other scan chains to the second predetermined value enables the output of the all other scan chains to be suppressed at the top level output.

16. The apparatus of claim 15 and wherein the debug circuit further comprises:
  input-side debug circuitry coupled to inputs of each different scan chain of the plurality of scan chains, and coupled to the top-level input; and
  output-side debug circuitry coupled to outputs of each different scan chain of the plurality of scan chains, and coupled to the top-level output.

17. The apparatus of claim 16 and further comprising the scan compression circuit, and wherein the scan compression circuit further comprises:
  a decompressor between the top-level input and the plurality of scan chains, the decompressor configured to receive scan patterns via the top-level input and configured to distribute the scan patterns to the plurality of scan chains; and
  a compressor between the plurality of scan chains and the top-level output, the compressor configured to provide a compressed scan test output representing the plurality of scan chains.

18. The apparatus of claim 17 and wherein the input-side debug circuitry comprises:
  a plurality of input-side AND gates; and
  a plurality of input-side multiplexers (MUXes),
  wherein:
    each different register of the plurality of registers is coupled to a first input of each different input-side AND gate of the plurality of input-side AND gates;
    the top-level input is coupled to a second input of each different input-side AND gate of the plurality of input-side AND gates;
    an output of each different input-side AND gate of the plurality of input-side AND gates is coupled to a first input of each different input-side MUX of the plurality of input-side MUXes;
    an output of the decompressor is coupled to a second input of each different input-side MUX of the plurality of input-side MUXes; and
    an output of each different input-side MUX of the plurality of input side MUXes is coupled to an input of each different scan chain of the plurality of scan chains.

19. The apparatus of claim 17 and wherein the output-side debug circuitry comprises:
  a plurality of output-side AND gates;
  an OR tree; and
  an output-side MUX,
  wherein:
    each different register of the plurality of registers is coupled to a first input of each different output-side AND gate of the plurality of output-side AND gates;
    an output of each different scan chain of the plurality of different scan chains is coupled to a second input of each different output-side AND gate of the plurality of output-side AND gates;
    an output of each different output-side AND gate of the plurality of output-side AND gates is coupled to each different input of a plurality of inputs of the OR Tree;

an output of the OR tree is coupled to a first input of the output-side MUX;

an output of the compressor is coupled to a second input of the output-side MUX; and an output of the output-side MUX is coupled to the top-level output.

20. The apparatus of claim 19 and wherein the OR tree comprises circuitry configured to concatenate the outputs of the plurality output-side AND gates.

\* \* \* \* \*

UNITED STATES PATENT AND TRADEMARK OFFICE
CERTIFICATE OF CORRECTION

| | |
|---|---|
| PATENT NO. | : 11,754,624 B1 |
| APPLICATION NO. | : 17/679686 |
| DATED | : September 12, 2023 |
| INVENTOR(S) | : Bharat Londhe et al. |

It is certified that error appears in the above-identified patent and that said Letters Patent is hereby corrected as shown below:

On the Title Page

Please insert (65) Prior Publication Data --US 2023/0266388 A1 August 24, 2023--.

Signed and Sealed this
Eighteenth Day of June, 2024

*Katherine Kelly Vidal*

Katherine Kelly Vidal
*Director of the United States Patent and Trademark Office*